(12) United States Patent
Asakura et al.

(10) Patent No.: US 9,091,595 B2
(45) Date of Patent: Jul. 28, 2015

(54) ANALYSIS METHOD, ANALYSIS DEVICE, AND ETCHING PROCESSING SYSTEM

(71) Applicant: Hitachi High-Technologies Corporation, Tokyo (JP)

(72) Inventors: Ryoji Asakura, Yokohama (JP); Kenji Tamaki, Kawasaki (JP); Akira Kagoshima, Kudamatsu (JP); Daisuke Shiraishi, Hikari (JP); Toshio Masuda, Hino (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 13/945,285

(22) Filed: Jul. 18, 2013

(65) Prior Publication Data

US 2014/0022540 A1 Jan. 23, 2014

(30) Foreign Application Priority Data

Jul. 20, 2012 (JP) ................................. 2012-161130

(51) Int. Cl.
| | | |
|---|---|---|
| *G01J 1/00* | (2006.01) | |
| *G01J 1/42* | (2006.01) | |
| *G01J 3/443* | (2006.01) | |
| *H01J 37/32* | (2006.01) | |

(52) U.S. Cl.
CPC .. *G01J 1/42* (2013.01); *G01J 3/443* (2013.01); *H01J 37/32935* (2013.01); *H01J 37/32963* (2013.01); *H01J 37/32972* (2013.01)

(58) Field of Classification Search
CPC ........................................................ G01J 1/42

USPC ................. 356/213, 229; 156/345.24, 345.25
See application file for complete search history.

(56) References Cited

U.S. PATENT DOCUMENTS

| | | | |
|---|---|---|---|
| 2008/0216956 A1* | 9/2008 | Nakamoto et al. ........ | 156/345.25 |
| 2009/0211706 A1* | 8/2009 | Uchida et al. ............. | 156/345.25 |
| 2011/0315661 A1 | 12/2011 | Morisawa et al. | |
| 2013/0173042 A1 | 7/2013 | Morisawa et al. | |

FOREIGN PATENT DOCUMENTS

| | | | |
|---|---|---|---|
| JP | 9-306894 | 11/1997 | |
| JP | H09-306894 | * 11/1997 | .......... H01L 21/3065 |
| JP | 2005-77325 | 3/2005 | |
| JP | 2010-219263 | 9/2010 | |

* cited by examiner

*Primary Examiner* — Kara E Geisel
*Assistant Examiner* — Dominic J Bologna
(74) *Attorney, Agent, or Firm* — Baker Botts L.L.P.

(57) ABSTRACT

Among the multiple OES data wavelengths, an analysis device identifies the wavelength of light emissions from a substance contained in the plasma from among multiple light emission wavelengths within the chamber by way of the steps of: measuring the light emission within the chamber during etching processing of the semiconductor wafer; finding the time-based fluctuation due to changes over time on each wavelength in the measured intensity of the light emissions in the chamber; comparing the time-based fluctuations in the wavelength of the light emitted from the pre-specified substance; and by using the comparison results, identifying the wavelength of the light emitted from the substance caused by light emission within the chamber.

6 Claims, 10 Drawing Sheets

FIG.3
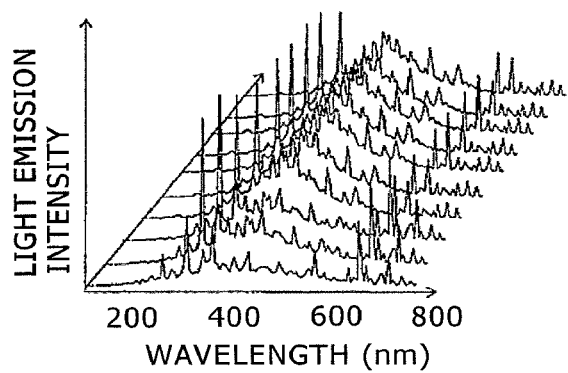
FIG.4
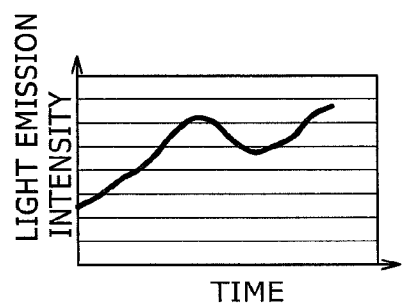
FIG.5
| SUBSTANCE | WAVELENGTH (nm) |
|---|---|
| Al | 308.2 |
| Al | 309.3 |
| Al | 394.4 |
| Al | 396 |
| AlCl | 261.4 |
| AlCl | 264.8 |
| AlCl | 268.3 |
| ... | ... |
| Ti | 294.2 |
| ... | ... |

FIG. 6

| TIME | WAVELENGTH(nm) | | | | | | | |
|---|---|---|---|---|---|---|---|---|
| | 201.1 | 201.2 | ... | 294.2 | ... | 300.0 | ... |
| 0 | 257.9 | 259.1 | ... | 259.4 | ... | 259.5 | ... |
| 0.5 | 256.9 | 258.7 | ... | 265.4 | ... | 276.5 | ... |
| 1 | 255.6 | 256.4 | ... | 268.3 | ... | 262.5 | ... |
| 1.5 | 255.3 | 256.4 | ... | 281.4 | ... | 261.2 | ... |
| 2 | 255.6 | 257.3 | ... | 287.3 | ... | 261.7 | ... |
| 2.5 | 255.2 | 256.8 | ... | 302.5 | ... | 265.4 | ... |
| 3 | 256.2 | 256.4 | ... | 316.8 | ... | 266.5 | ... |
| 3.5 | 256.0 | 257.5 | ... | 327.9 | ... | 265.3 | ... |
| 4 | 256.4 | 256.9 | ... | 337.3 | ... | 262.2 | ... |
| 4.5 | 256.0 | 257.6 | ... | 357.0 | ... | 273.2 | ... |
| ... | ... | ... | ... | ... | ... | ... | ... |
| 100 | 254.8 | 255.5 | ... | 470.5 | ... | 266.3 | ... |

FIG. 7

| SUBSTANCE | Al | | | |
|---|---|---|---|---|
| | | WAVELENGTH (nm) | | | |
| | | 308.2 | 309.3 | 394.4 | 396 |
| WAVELENGTH (nm) | 308.2 | 1 | 0.96 | 0.77 | 0.78 |
| | 309.3 | 0.97 | 1 | 0.71 | 0.75 |
| | 394.4 | 0.77 | 0.71 | 1 | 0.98 |
| | 396 | 0.78 | 0.75 | 0.98 | 1 |

FIG. 8

| SUBSTANCE | WAVELENGTH (nm) | PERIPHERAL WAVELENGTH (nm) | LIGHT EMISSION INTENSITY CORRELATION 2 |
|---|---|---|---|
| Al | 308.2 | 258.2 ~ 358.2 | 0.93 |
| Al | 309.3 | 259.3 ~ 359.3 | 0.95 |
| Al | 394.4 | 344.4 ~ 444.4 | 0.98 |
| Al | 396 | 346 ~ 446 | 0.97 |
| AlCl | 261.4 | 211.4 ~ 311.4 | 0.95 |
| ... | ... | ... | ... |
| Ti | 294.2 | 244.2 ~ 344.2 | -0.75 |
| ... | ... | ... | ... |

FIG. 9

| THRESHOLD VALUE 1 | THRESHOLD VALUE 2 | THRESHOLD VALUE 3 |
|---|---|---|
| 0.95 | 0.5 | 0.5 |

FIG. 10

| SUBSTANCE | WAVELENGTH (nm) | RECOMMENDED WAVELENGTH (nm) |
|---|---|---|
| Al | 308.2 | |
| Al | 309.3 | |
| Al | 394.4 | |
| Al | 396 | |
| AlCl | 261.4 | RECOMMENDATION 1 |
| AlCl | 264.8 | |
| AlCl | 268.3 | |
| ... | ... | |
| Ti | 294.2 | RECOMMENDATION 2 |
| ... | ... | |

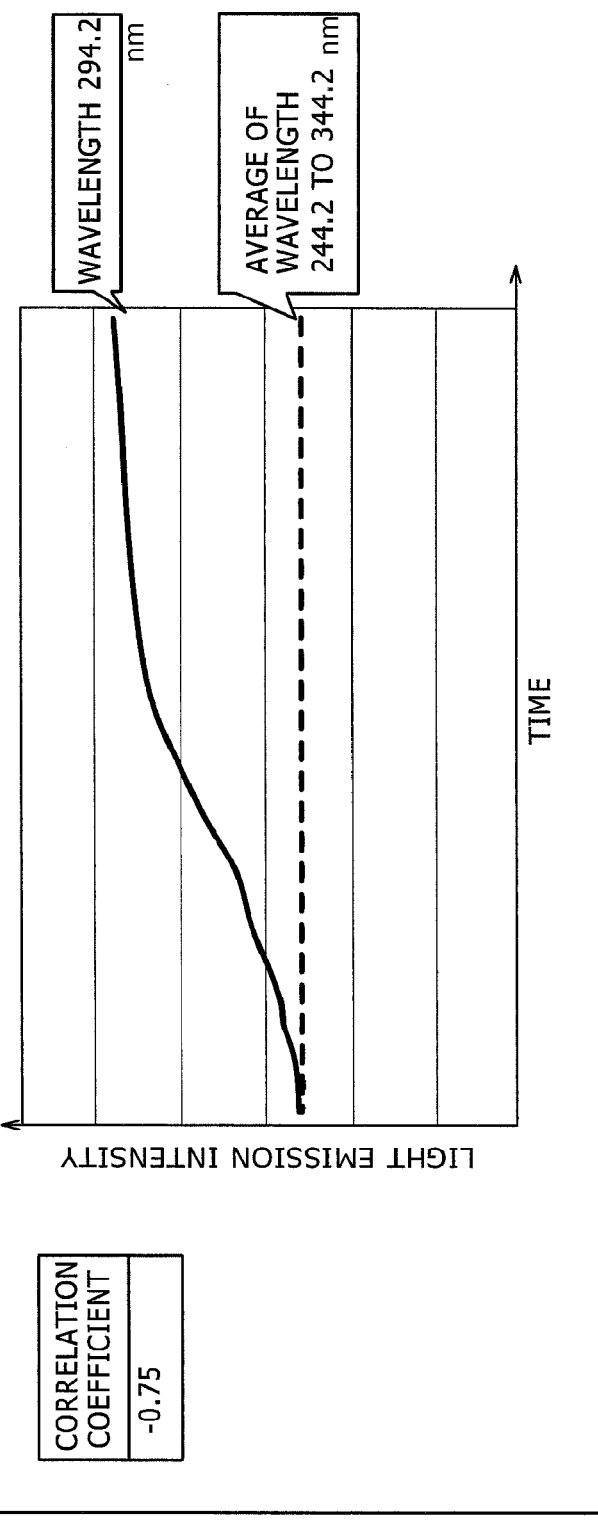

ANALYSIS METHOD, ANALYSIS DEVICE, AND ETCHING PROCESSING SYSTEM

BACKGROUND

The present invention relates to a method for selecting a wavelength to affect the etching processing results, from light emission data measured during plasma etching processing (hereafter called etching processing) in etching devices that machine the semiconductor wafer by using plasma.

In order to achieve a microscopic shape such as for a semiconductor device formed over a wafer, plasma is utilized to ionize a substance, and by using the effect from that substance, (reaction with wafer surface) etching is performed to remove a substance over the wafer. There are a variety of substances for ionizing and there are also many types and forms of substances over the wafer material used according to the required product performance.

Moreover, in order to form a shape over the wafer, an organic substance resist is coated over the wafer, a shape is formed by photolithography, and etching performed. A substance is also placed whose reaction speed can be adjusted in order to obtain a specified shape. A variety of types and forms of substances that react with each other can be placed within the chamber for performing the etching process.

The ionizing phenomenon implemented by plasma is accompanied by a light emission phenomenon, so etching devices that utilize plasma in the etching process include a spectroscope (OES: Optical Emission Spectroscope) capable of monitoring the plasma emission status.

Data measured by a spectroscope is hereafter called OES data.

The OES data contains two dimensional spatial and temporal elements and expresses the emission intensity values respectively measured at each time and wavelength.

The light emission intensity values fluctuate according to the state of the etching process so the etching process is controlled by using the OES data. In one example of this control, the etching process is terminated or the inflow gas quantity is reduced when a specified wavelength value among the OES data has exceeded the threshold.

Japanese Unexamined Patent Application Publication No. Hei9 (1997)-306894 discloses a method for identifying the wavelength used for controlling the etching from the OES data.

Japanese Unexamined Patent Application Publication No. Hei9 (1997)-306894 discloses a method to analyze the emitted light occurring along with the plasma processing by the plasma device, and automatically setting an optimal wavelength for detecting a pre-established endpoint prior to executing plasma processing based on fluctuations over accumulated time in the light emission intensity on the specified wavelength. More specifically, a method is disclosed for setting a wavelength whose maximum value is the differential detected by an intensity differential detector circuit, as the optimal wavelength.

SUMMARY

The advances in recent years in making ever tinier and detailed patterns on the semiconductor wafer serving as the object for etching have created a need for higher accuracy when performing the etching process.

The state of the substance contained in the plasma is strongly related to the results obtained in the etching process. An important element required for performing a high-accuracy etching process is observing the light emission from the plasma within the chamber during the etching process, and identifying the wavelength exhibiting the light emitted from the substance contained in the plasma during observation of the light emission. The etching process can be improved to a high degree of accuracy by monitoring the etching state through using information (light emission intensity values and fluctuation quantities) on the light emissions from the substance contained in the plasma, and supervising and controlling the processing.

Among the etching processes, Japanese Unexamined Patent Application Publication No. Hei9 (1997)-306894 discloses a method to detect the endpoint as the timing at which etching ends in the etching process. However, the method disclosed in Japanese Unexamined Patent Application Publication No. Hei9 (1997)-306894 selects the wavelength after evaluating the light emission intensity at two specified time points and therefore has the problem of being incapable of selecting an effective wavelength when controlling the etching process with the light emission intensity at time points (such as an intermediate time point in the etching process) other than those two time points.

Another problem was that determining whether or not the light emission intensity at the selected wavelength was caused by the substance contained in the plasma.

Whereupon the present invention has the object of providing an OES data analysis method, analysis program, analysis device, and analysis system to identify the wavelength that exhibits light emission from the substance contained in the plasma from OES data from observation of light emissions during etching, and monitor, supervise, and control the etching process.

In order to achieve the above object, a representative mode of the present invention is featured in including the following configuration in an etching device containing an analysis unit to process the OES data.

The present invention has the unique feature of including the steps of: measuring the light emission within the chamber during the semiconductor wafer etching process; finding the time-based fluctuations for each wavelength due to variations over time in the measured light emission intensity of the light emissions in the chamber; comparing the time-based fluctuations corresponding to the wavelength of the light emission by the pre-specified substance; and based on the compared results, identifying the specified wavelength of light emitted from the substance contained in the plasma within the chamber.

The present invention is capable of identifying the wavelength where light is emitted from the substance contained in the plasma within the chamber, from the plurality of wavelengths in the OES data.

BRIEF DESCRIPTION OF THE DRAWINGS

FIG. 3 is a drawing for describing an example of the OES data;

FIG. 4 is a graph for describing time-based fluctuations in OES data at a specified wavelength;

FIG. 5 is a drawing for showing an example of a substance and matching wavelength table;

FIG. 6 is a drawing for showing an example of an OES data table;

FIG. 7 is a drawing for showing an example of an identical substance correlating information table;

FIG. 8 is a drawing for showing an example of a peripheral wavelength correlating information table;

FIG. 9 is a drawing for showing an example of a threshold information table;

FIG. 10 is a drawing for showing an example of a recommended wavelength information table;

FIG. 16 is a drawing for showing an example of the display screen of the first embodiment of the present invention.

DETAILED DESCRIPTION

Figure 1:
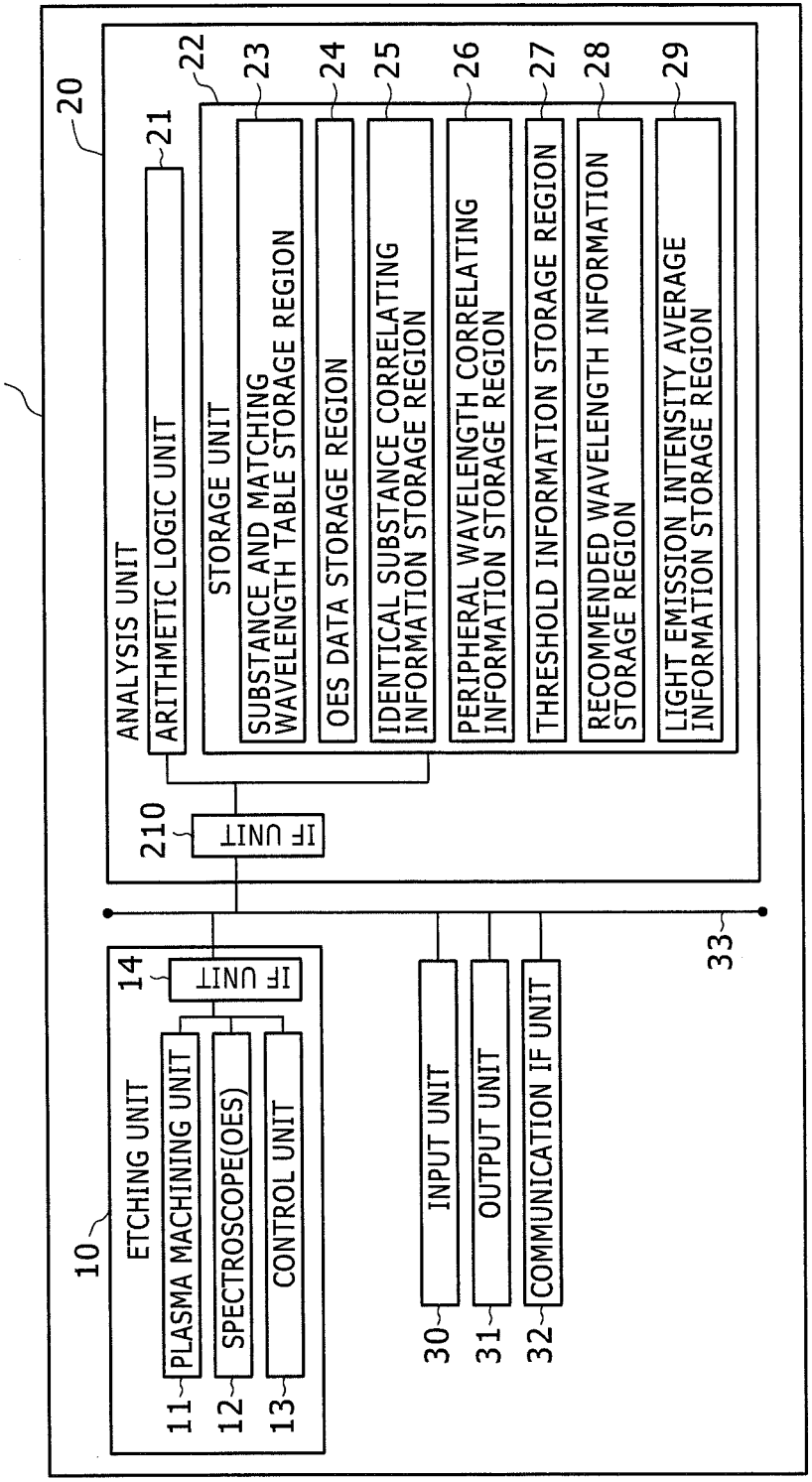
FIG. 1 is a block diagram showing the configuration of the etching device of the first embodiment of the present invention.

The embodiments of the present invention are described next while referring to the accompanying drawings. In all drawings for describing the embodiments, the same reference numerals are generally attached to the same members, and their redundant descriptions are omitted.

[Etching Device]

In the present invention, the etching device 1 as shown in the block diagram in FIG. 1, includes an etching unit 10, analysis unit 20, input unit 30, output unit 31, and communication IF unit 32, and also a bus 33 to mutually connect these components.

Figure 2:
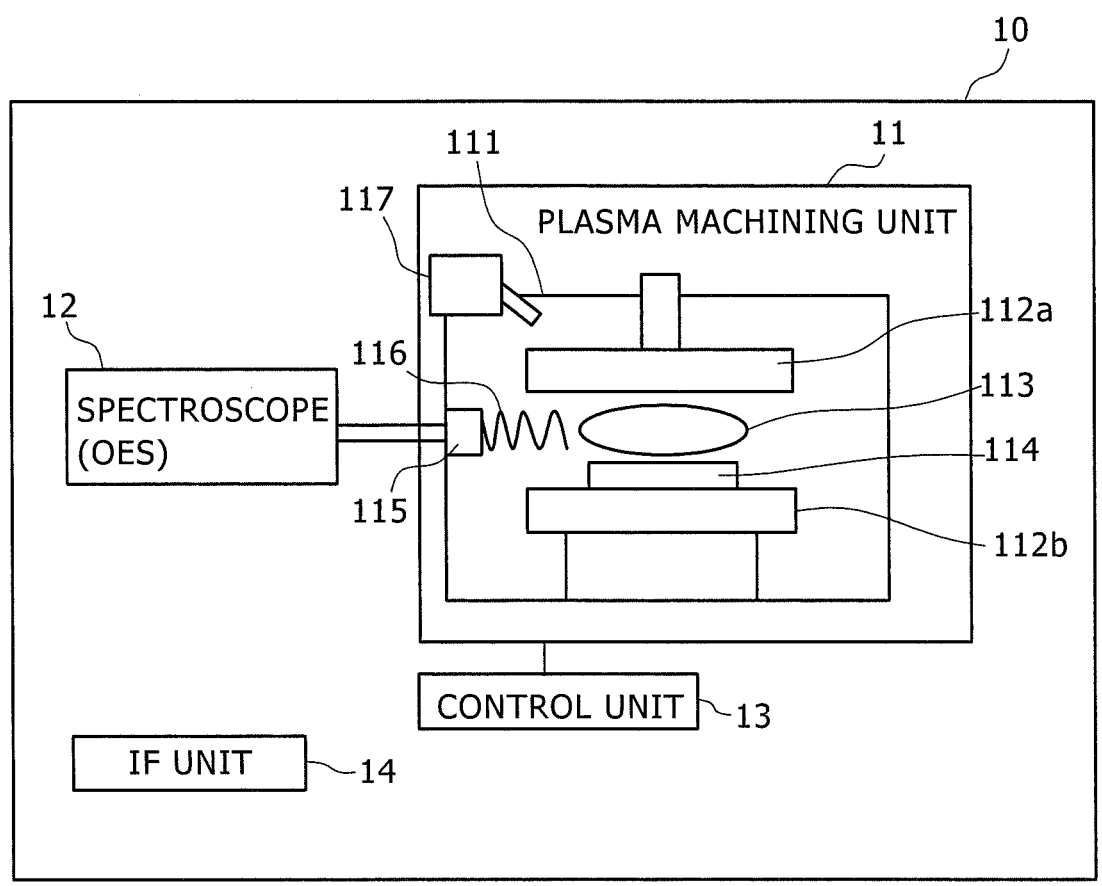
FIG. 2 is a block diagram showing the configuration of the etching unit of the first embodiment of the present invention.

The etching unit 10 includes a plasma machining unit 11, a spectroscope (OES) 12, a control unit 13, and an IF unit 14. The plasma machining unit 11 generates the plasma and machines the wafer, and while the etching is being performed, the spectroscope (OES) 12 obtains the light emission data from the plasma serving as the OES data. The OES data is stored by way of the IF unit 14, into the storage unit 22 contained in the analysis unit 20. The control unit 13 controls the processing by the plasma machining unit 11. The etching unit 10 is described in detail later while referring to FIG. 2.

The analysis unit 20 contains an arithmetic logic unit 21 to process the collected OES data, a storage unit 22 to store OES data, data showing the wavelength of the light emitted from each substance, and the processed results, and an IF unit 210. The arithmetic logic unit 21 obtains time-based data on the plural light emission intensities from the OES data, calculates the degree of similarity such as the correlation coefficient among the obtained time-based data, and performs processing to identify the wavelength required for monitoring, supervising, and controlling the etching process, from the extent of the degree of similarity. The processing by the arithmetic logic unit 21 is described in detail while referring to FIG. 13.

The input unit 30 is for example a mouse or keyboard that receives information input by user operation. The output unit 31 is a display or printer for outputting information to the user. The communication IF unit 32 is an interface connectable to other systems (also connectable to currently used production control systems etc.) by way of the bus 33 and an external network, and for sending and receiving information. The bus 33 couples each component (10, 20, 30, 31, and 32). Each IF unit (14, 29, etc.) are interfaces for sending and receiving information by way of the bus 33. The analysis unit 20 may also be connected as an analysis device outside of the etching device 1.

[Etching Unit]

The etching unit 10 is comprised of the plasma machining unit 11, a spectroscope (OES) 12, a control unit 13, and an IF unit 14. The plasma machining unit 11 includes a chamber 111, electrode 112a and 112b, a window 115, and a gas supply device 117. In response to instructions from the control unit 13, the plasma machining unit 11 stores the wafer 114 inside the chamber ill, supplies the etching gas from the gas supply device 117, and causes the gas 113 made into plasma to strike the wafer 114 by applying a voltage using the electrode 112a and 112b, to machine the wafer 114. The gas 113 contains substances in the etching gas supplied from the gas supply device 117 and substances generated in the wafer 114 from the machining process. A light 116 is emitted at a wavelength according to the substance contained in the gas. The emitted light passes through the window 115 and is measured by the spectroscope (OES) 12.

[OES Data]

FIG. 3 is a drawing for describing an example of the OES data measured by the spectroscope (OES) 12. The OES data contains two dimensional spatial and temporal elements, and expresses the light emission intensity value respectively measured at each wavelength and time. FIG. 4 is a graph for describing time-based fluctuations in light emission intensity at a specified wavelength. The light emission intensity value varies with the time as shown in FIG. 4. The locus of the time-based fluctuations varies with the wavelength.

[Analysis Unit]

The analysis unit 20 as shown in FIG. 1, includes an arithmetic logic unit 21, a storage unit 22, and an IF unit 210. The storage unit 22 contains a substance and matching wavelength table storage region 23, OES data storage region 24, identical substance correlating information storage region 25, peripheral wavelength correlating information storage region 26, threshold information storage region 27, and recommended wavelength information storage region 28.

Information specifying the wavelength of light 116 from the substance possible contained in the gas 113 is stored in the substance and matching wavelength table storage region 23. The substance is a single element or coupled from plural elements, and the wavelength of the light emitted from each substance is identified by measurements made beforehand. The substances as described here are not constantly contained in the gas 113. Moreover, if the wavelengths of light emitted from each substance are the same then the substances are identical even if the conditions for the etching device 1 are different.

FIG. 5 shows a substance and matching wavelength table 23a serving as the first embodiment of the substance and matching wavelength table storage region 23. This table contains respective fields such as the substance field 23b, and wavelength field 23c, etc.

Information for identifying the substance possibly contained in the gas 113 is stored in the substance field 23b.

Information for identifying the wavelength of light emitted from the substance specified in substance field 23b is stored in the wavelength field 23c. The wavelength specified by the wavelength field 23c is made to correspond to one or a plurality of substances.

The light emission intensity value for wavelengths stored in the wavelength field 23c among OES data might not necessarily always be determined by the light emission from a substance (stored on the same row) linked to the substance field 23b. Therefore, monitoring, supervision, and control of the plasma machining unit 11 requires identifying a substance whose light emission intensity is determined by light emission from a substance linked to the substance field 23b among the wavelengths stored in the wavelength field 23c.

The OES data storage region 24 contains information specifying OES data measured by the spectroscope (OES) 12.

FIG. 6 shows the OES data table 24a serving as the first embodiment of the OES data storage region 24. This table contains each field such as a wavelength field 24b, time field 24c, light emission intensity field 24d, etc.

Information for identifying the wavelength of the measured OES data is stored in the wavelength field 24b. Rows storing values identical to the values stored in wavelength field 23c of the previously described substance and matching wavelength table 23a are present in the wavelength field 24b.

Information specifying the time of the measured OES data is stored in the time field 24c.

Information for specifying the light emission intensity of the OES data for the wavelength specified via the wavelength field 24b and the time specified via the time field 24c is stored in the light emission intensity field 24d.

Results from calculating the correlation coefficient serving as the degree of similarity for time-based data of light emission intensity for items applicable to the wavelength stored in the substance and matching wavelength table storage region 23 among OES data stored in the OES data storage region 24, are stored in the identical substance correlating information storage region 25.

FIG. 7 is a drawing showing an example of an identical substance correlating information table 25a serving as the first embodiment of the identical substance correlating information storage region 25. This table contains each field such as a substance field 25b, a wavelength field (column direction) 25c, a wavelength field (row direction) 25d, a light emission intensity correlation 1 field 25e, etc.

Names for each substance emitting light on a wavelength specified by the values stored in wavelength field (column direction) 25c and wavelength field (row direction) 25d are stored in the substance field 25b.

The substance specified by the value stored in the substance field 25b, is stored in the wavelength field (column direction) 25c as information specifying the wavelength linked via the substance and matching wavelength table 23a.

Substances specified by the value stored in the substance field 25b are stored in the wavelength field (row direction) 25d, in the same way as the wavelength field (column direction) 25c, as information specifying the wavelength linked via the substance and matching wavelength table 23a.

The light emission intensity correlation 1 field 25e stores information specifying the correlation coefficient serving as the degree of similarity for both time-based fluctuations in light emission intensity at a wavelength specified by a value stored in the wavelength field (column direction) 25c; and time-based fluctuations in light emission intensity at a wavelength specified by a value stored in the wavelength field (row direction) 25d. The above described time-based fluctuations in light emission intensity are values specified by way of the OES data table 24a.

Results from calculating the correlation coefficient serving as the degree of similarity for time-based data for light emission intensity for an applicable wavelength stored in the substance and matching wavelength table storage region 23 among the OES data stored in the OES data storage region 24, are stored in the peripheral wavelength correlating information storage region 26.

FIG. 8 shows the peripheral wavelength correlating information table 26a serving as the first embodiment of the peripheral wavelength correlating information storage region 26. This table contains each table such as a substance field 26b, a wavelength field 26c, a peripheral wavelength field 26d, and a light emission intensity correlation 2 field 26e.

The substance field 26b stores each substance name corresponding to the value stored in the substance field 23b of the substance and matching wavelength table 23a.

The wavelength field 26c stores values for wavelengths corresponding to values stored in the wavelength field 23c of the substance and matching wavelength table 23a.

The peripheral wavelength field 26d stores information showing the peripheral range of the wavelengths, with wavelengths specified by values stored in the wavelength field 26c utilized as a reference standard. In the example in FIG. 8, a value where 50 was subtracted from the value stored in wavelength field 26c, up to a value where 50 was added to the value stored in the wavelength field 26c are stored in the peripheral wavelength field 26d, however a value other than 50 may be utilized, and the subtracted value and the added value may be mutually different values.

The light emission intensity correlation 2 field 26e stores information specifying the correlation coefficient serving as the degree of similarity, for time-based fluctuations for light emission intensity in the wavelength specified by the value stored in the wavelength field 26c; and the averaged time-based fluctuations for light emission intensity in the wavelength range specified by the value stored in the peripheral wavelength field 26d. The above described time-based fluctuations in light emission intensity are values specified via the OES data table 24a. The above described averaged time-based fluctuations for light emission intensity are values specified via the light emission intensity average information table 29a described later on.

Conditions for selecting a wavelength suitable for use in monitoring, supervision, and control of the etching unit 10 are stored in the threshold information storage region 27.

FIG. 9 shows the threshold information table 27a serving as the first embodiment of the threshold information storage region 27. This table contains each field such as the threshold value 1 field 27b, threshold value 2 field 27c, and threshold value 3 field 27d, etc.

The threshold value 1 field 27b stores information for specifying the cell storing a large correlation coefficient for the light emission intensity correlation 1 field 25e of the identical substance correlating information table 25a.

The threshold value 2 field 27c stores information for specifying the wavelength to serve as the recommended wavelength, by using information stored in the identical substance correlating information table 25a.

The threshold value 3 field 27d stores information for specifying the wavelength to serve as the recommended wavelength, by using information stored in the peripheral wavelength correlating information table 26a.

The recommended wavelength information storage region 28 stores information used for specifying the wavelength to be utilized for monitoring, supervision, and control of the etching unit 10 from among the wavelengths stored in the substance and matching wavelength table storage region 23.

FIG. 10 shows the recommended wavelength information table 28a serving as the first embodiment of the recommended wavelength information storage region 28. This table includes each field such as the substance field 28b, the wavelength field 28c, and the recommended wavelength field 28d, etc.

The substance field 28b stores the name of the substance corresponding to the values stored in the substance field 23b in the substance and matching wavelength table 23a.

The wavelength field 28c stores the value of the wavelength corresponding to the value stored in the wavelength field 23c of the substance and matching wavelength table 23a.

The recommended wavelength field 28d stores information for specifying the wavelength ideal for use in monitoring, supervision, and control of the etching unit 10 from the wavelengths specified by way of the value stored in the wavelength field 28c.

The light emission intensity average information storage region 29 stores information for specifying the value that the OES data stored in the OES data storage region 24 is averaged in the specified wavelength zone.

Figure 11:
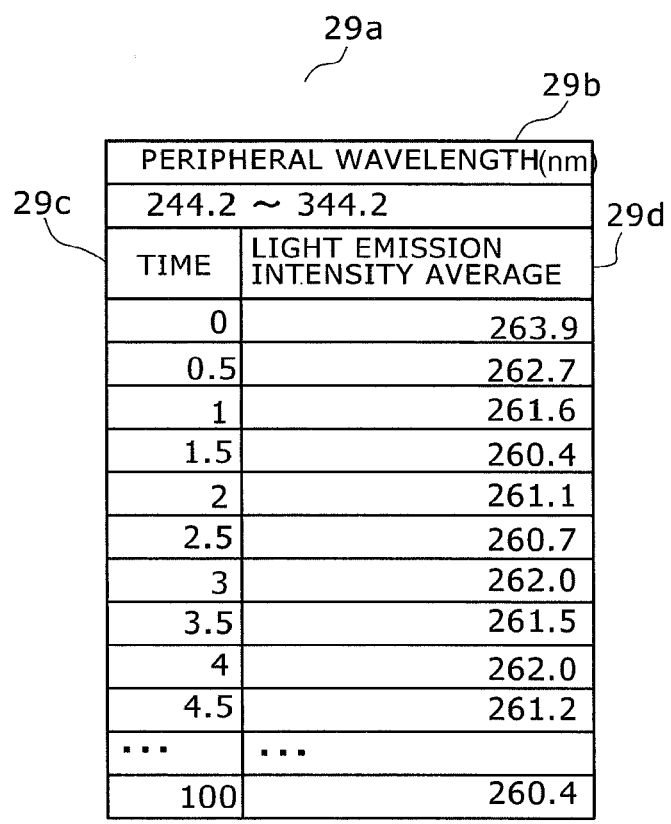
FIG. 11 is a drawing for showing an example of a light emission intensity average information table.

FIG. 11 shows the light emission intensity average information table 29a serving as the first embodiment of the light emission intensity average information storage region 29. This table contains each field such as peripheral wavelength field 29b, time field 29c, and light emission intensity average field 29d, etc.

The peripheral wavelength field 29b stores information specifying the peripheral range of the wavelength whose calculated light emission intensity average was specified by way of a value stored in the light emission intensity average field 29d.

The time field 29c stores information for specifying the measured time of the light emission intensity average specified by way of the value stored in the light emission intensity average field 29d.

Information specifying averaged results in a range specified by way of a value stored in the peripheral wavelength field 29b, from values stored in the light emission intensity field 24d of OES data table 24a is stored in the light emission intensity average field 29d.

[Analysis Process by Analysis Unit 20]

Figure 12:
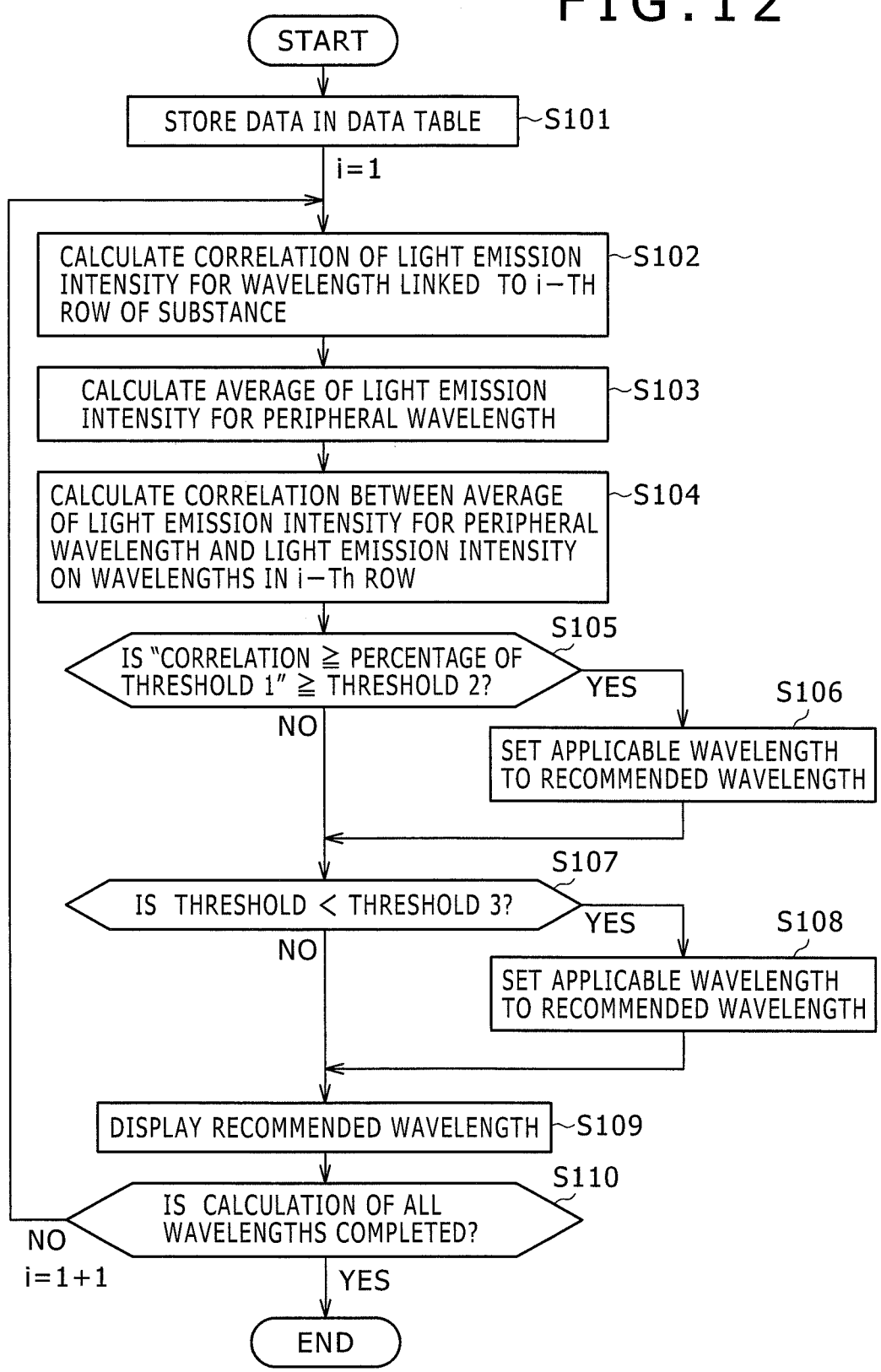
FIG. 12 is a flow chart for showing the process flow in the analysis device for the first embodiment of the present invention.

FIG. 12 shows analysis processing (expressed in processing steps such as S101) performed mainly by the arithmetic logic unit 21 in the analysis unit 20. The analysis process is described while referring to FIG. 12.

The arithmetic logic unit 21 implements the analysis processing shown in FIG. 12 when the etching processing by the etching unit 10 ends or the user inputs a command to execute the analysis process. The respective values are stored in the substance and matching wavelength table 23a, the OES data table 24a, and the threshold information table 27a, at the stage where executing the analysis process. The values measured in past testing is stored in the substance and matching wavelength table 23a, the values measured by the spectroscope (OES) 12 is stored in the OES data table 24a, and the values set by the designer is stored in the threshold information table 27a.

(S101)

In S101, the arithmetic logic unit 21 stores the required data for calculation in each data table.

First of all, the arithmetic logic unit 21 stores the value stored in the substance field 23b in the substance and matching wavelength table 23a, into the substance field 26b of the peripheral wavelength correlating information table 26a, and stores the value stored in the wavelength field 23c of the substance and matching wavelength table 23a, into the wavelength field 26c.

The arithmetic logic unit 21 also stores the value stored in the substance field 23b in the substance and matching wavelength table 23a, into the substance field 28b of the recommended wavelength information storage table 28a, and stores the value stored in the wavelength field 23c of the substance and matching wavelength table 23a, into the wavelength field 28c.

The arithmetic logic unit 21 further stores the value stored in the time field 24c of the OES data table 24a into the time field 29c of the light emission intensity average information table 29a.

When step S101 ends, the arithmetic logic unit 21 stores a in the value i showing a row number in the substance and matching wavelength table 23a.

(S102)

In S102, the arithmetic logic unit 21 calculates the correlation of the time-based data for light emission intensity between identical substances, using information in the OES data table 24 as input, and stores the calculated correlation in the identical substance correlating information table 25a.

First of all, the arithmetic logic unit 21 deletes all data in the identical substance correlating information table 25a.

The arithmetic logic unit 21 loads the value (substance i) stored in the i-th row of the substance field 23b in the substance and matching wavelength table 23a, and stores the value in the substance field 25b of the identical substance correlating information table 25a.

The arithmetic logic unit 21 scans the substance field 23b in the substance and matching wavelength table 23a from the first row to the final row, and for the row storing a value identical to substance i, stores the value stored on the applicable row of wavelength field 23c into the final column of wavelength field (column direction) 25c, and final row of wavelength field (row direction) 25d. If there is already a value stored in the final column then one column is added to the final column, and the value stored in the applicable column. Also, if there is already a value stored in the final row, one row is added to the final row in the same way, and the value stored in the applicable row. This process stores a value identifying a wavelength corresponding to substance i, in the wavelength field (column direction) 25c and wavelength field (row direction) 25d of the identical substance correlating information table 25a.

The arithmetic logic unit 21 further stores the value in the light emission intensity correlation 1 field 25e. By setting the column number of wavelength field (column direction) 25c as j, and the row number of wavelength field (row direction) as k, the value ($r_1$) stored in k row j column of light emission intensity correlation 1 field 25e can be calculated by way of the following formula (1).

$$r_1 = \left[ \frac{\left\{ \sum_{l=1}^{n}\left(x_{lp} - \sum_{m=1}^{n} x_{mp}/n\right)\left(x_{lq} - \sum_{m=1}^{n} x_{mq}/n\right)\right\}^2}{\left\{\sum_{l=1}^{n}\left(x_{lp} - \sum_{m=1}^{n} x_{mp}/n\right)^2\right\}\left\{\sum_{l=1}^{n}\left(x_{lq} - \sum_{m=1}^{n} x_{mq}/n\right)^2\right\}} \right]^{\frac{1}{2}} \quad \text{Formula (1)}$$

The significance of each symbol in formula (1) is given as follows.

Here in wavelength field 24b of OES data table 24a, the symbol p denotes the column number storing a value identical to the value stored in the j column of wavelength field (column direction) 25c.

In wavelength field 24b of OES data table 24a, the symbol q denotes the column number storing a value identical to the value stored in the k row of the wavelength field (row direction) 25d.

The symbol xlp denotes the value stored in l row p column, among the values stored in the light emission intensity field 24d of the OES data table 24a.

The symbol $x_{mp}$ denotes the value stored in m row p column among the values stored in the light emission intensity field 24d of the OES data table 24a.

The symbol $x_{lq}$ denotes the value stored in l row q column among the values stored in the light emission intensity field 24d of the OES data table 24a.

The symbol $x_{mq}$ denotes the value stored in m row q column among the values stored in the light emission intensity field 24d of the OES data table 24a.

The symbol n expresses the number of rows of the light emission intensity field 24d in the OES data table 24a.

The symbol $r_1$ is the value (correlation coefficient) calculated in formula (1). The symbol $r_1$ expresses the extent of the degree of similarity of the time-based fluctuation for the value stored in the p column of light emission intensity field 24d, and the value stored in the q column of light emission intensity field 24d.

Figure 13:
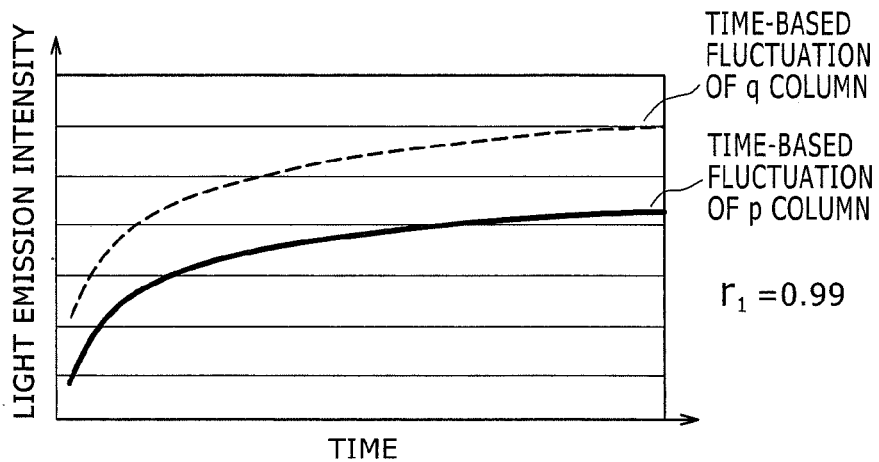
FIG. 13 is a graph for showing an example of the case of a correlation in time-based fluctuations among wavelengths.

FIG. 13 is graphs of the time-based fluctuations in light emission intensity, and shows the value for correlation coefficient $r_1$ among the time-based fluctuations expressed in these two graphs. The time-based fluctuations in the two graphs are similar, and a large correlation coefficient $r_1$ can also be observed.

The formula (1) utilizes a correlation coefficient but other indices for evaluating the degree of similarity may also be utilized.

The arithmetic logic unit 21 calculates the correlation coefficient using formula (1) for all combinations of rows and columns in light emission intensity correlation 1 field 25e, and stores the calculated value.

(S103)

In S103, the arithmetic logic unit 21 inputs information from OES data table 24a, calculates the average value of light emission intensity on wavelengths peripheral to the wavelength of the i-th row, and stores that average value in the light emission intensity average information table 29a.

The arithmetic logic unit 21 first of all loads the value stored in the i-th row of wavelength field 23c into the substance and matching wavelength table 23a, and sets the peripheral range of the wavelength using the loaded value as a reference. In the present embodiment, a value where 50 is subtracted from the loaded value is set as the minimum value, and a value where 50 is added to the loaded value is set as the maximum value.

The arithmetic logic unit 21 stores the set range in a "Minimum value range to maximum value range" format in the i-th row of peripheral wavelength field 26d in the peripheral wavelength correlating information table 26a, and in the peripheral wavelength field 29b of the light emission intensity average information table 29a.

The arithmetic logic unit 21 next calculates the average value for light emission intensity on the peripheral wavelength using the following formula (2), from the first row to the final row of the light emission intensity field 24d in the OES data table 24, and stores the calculated value ($AVE_o$) in the light emission intensity average field 29d of the light emission intensity average information table 29a.

$$Ave_o = \left(\sum_{s=1}^{u} f(x_{os})\right) / \left(\sum_{s=1}^{u} g(x_{os})\right) \quad \text{Formula (2)}$$

$$f(x_{os}) = \begin{cases} x_{os}, & \lambda_s \geq \lambda_{min} \text{ and } \lambda_s \leq \lambda_{max} \text{ and } \lambda_s \neq \lambda_i \\ 0, & \text{other than those above} \end{cases}$$

$$g(x_{os}) = \begin{cases} 1, & \lambda_s \geq \lambda_{min} \text{ and } \lambda_s \leq \lambda_{max} \text{ and } \lambda_s \neq \lambda_i \\ 0, & \text{other than those abov} \end{cases}$$

The meaning of each symbol in formula (2) is given as follows.

Here, the symbol o denotes the row number for the light emission intensity 24d in the OES data table 24.

The symbol $X_{os}$ denotes the value stored in o row s column among the values stored in the light emission intensity field 24d of the OES data table 24a.

The symbol $\lambda_s$ denotes the value stored in the s column, among the values stored in the wavelength field 24b of the OES data table 24a.

The symbol $\lambda_{min}$ denotes the minimum value stored in the above described range.

The symbol $\lambda_{max}$ denotes the maximum value stored in the above described range.

The symbol $\lambda_i$ denotes the value stored in the i-th row of the wavelength field 23c in the substance and matching wavelength table 23a.

The symbol u denotes the number of columns in the wavelength field 24c of the OES data table 24a.

The symbol $AVE_o$ denotes the value stored in the o row of the light emission intensity average field 29d in the light emission intensity average information table 29a.

The formula (2) signifies the calculation of the average of the light emission intensity for a wavelength, contained in the range of values stored on the i-th row of the peripheral wavelength field 26d in the peripheral wavelength correlating information table 26a, and also not matching the value stored on the i-th row of the wavelength field 23c in the substance and matching wavelength table 23a. The light emission intensity for a wavelength matching the value stored on the i-th row is here excluded from the calculation of the average value but may also be included in the calculation.

(S104)

In step S104, the arithmetic logic unit 21 calculates the correlation of the time-based data for light emission intensity between information stored in the light emission intensity field 24d of the OES data table 24a, and the information stored in the light emission intensity average field 29d of the light emission intensity average information table 29a, and stores the calculated value in the light emission intensity correlation 2 field 26e of the peripheral wavelength correlating information table 26a.

The arithmetic logic unit 21 stores the value ($r_2$) calculated by the following formula (3), into the i-th row of the light emission intensity correlation 2 field 26e.

$$r_2 = \left[ \frac{\left\{ \sum_{l=1}^{n} \left( x_{lp} - \sum_{m=1}^{n} x_{mp}/n \right) \left( y_l - \sum_{m=1}^{n} y_l/n \right) \right\}^2}{\left\{ \sum_{l=1}^{n} \left( x_{lp} - \sum_{m=1}^{n} x_{mp}/n \right)^2 \right\} \left\{ \sum_{l=1}^{n} \left( y_l - \sum_{m=1}^{n} y_l/n \right)^2 \right\}} \right]^{\frac{1}{2}} \quad \text{Formula (3)}$$

The meaning of each symbol in formula (3) is given as follows.

Here, the symbol p denotes the column number storing a value identical to the value in the i-th row of the wavelength field 23c is stored in the wavelength field 24b of the OES data table 24a.

The symbol $X_{lp}$ denotes the value stored in l row p column among the values stored in the light emission intensity field 24d of the OES data table 24a.

The symbol $y_l$ denotes the value stored in l row among the values stored in the light emission intensity average field 29d of the light emission intensity average information table 29a.

The symbol n expresses the number of rows of the light emission intensity field 24d in the OES data table 24a.

The symbol $r_2$ is a value (correlation coefficient) calculated in formula (3). The symbol $r_2$ expresses the extent of the degree of similarity of the time-based fluctuation between the value stored in the p column of the light emission intensity field 24d in the OES data table 24a, and the value stored in the q column in the light emission intensity field 24d.

The formula (3) utilized a coefficient correlation but other indices for evaluating the degree of similarity may also be utilized.

(S105)

In step S105, the arithmetic logic unit 21 utilizes the information stored in the identical substance correlating information table 25a to judge whether or not the wavelength specified by way of the value stored on the i-th row of wavelength field 23c in the substance and matching wavelength table 23a is the wavelength capable of being utilized for monitoring, supervision and control of the etching unit 10.

The arithmetic logic unit 21 utilizes the value stored in the light emission intensity correlation 1 field 25e of the identical substance correlating information table 25a as an input, to calculate by way of the following formula (4) the percentage ($R_1$) by which the value stored in the light emission intensity correlation 1 field 25e is larger than the value stored in the threshold value 1 field 27b of the threshold information table 27a.

$$R_1 = \begin{cases} \sum_{w=1}^{a} h(z_{vw})/(a-1), & a \neq 1 \\ 0, & a = 1 \end{cases} \quad \text{Formula (4)}$$

$$h(z_{vw}) = \begin{cases} 1, & z_{vw} \geq Th_1 \text{ and } \lambda_v \neq \lambda_w \\ 0, & \text{other than those above} \end{cases}$$

The meaning of each symbol in formula (4) is given as follows.

The symbol v denotes the row number storing a value identical to the value stored in the i-th row of the wavelength field period 23c, into the wavelength field (row direction) 25d of the identical substance correlating information table 25a.

The symbol w is the value for specifying the column number of the light emission intensity correlation 1 field 25e of the identical substance correlating information table 25a.

The symbol a denotes the number of columns in the light emission intensity correlation 1 field 25e of the identical substance correlating information table 25a.

The symbol $Z_{VW}$ denotes the value stored in the v row w column among the values stored in the light emission intensity correlation 1 field 25e of the identical substance correlating information table 25a.

The symbol $Th_1$ denotes the value stored in the threshold value 1 field 27b of the threshold information table 27a.

The symbol λv denotes the value stored in the v row, among the values stored in the wavelength field (row direction) 25d in the identical substance correlating information table 25a.

The symbol λw denotes the value stored in the w column, among the values stored in the wavelength field (column direction) in the identical substance correlating information table 25a.

The symbol $R_1$ is a calculated value and indicates the percentage by which the correlation coefficient for light emission intensity of the wavelength specified by the value stored in the i-th row of the wavelength field 23c of the substance and matching wavelength table 23a is larger than the value specified in the threshold 1 field 27b. A large $R_1$ value indicates that the light emission intensity on the wavelength linked to the identical substance has similar time-based fluctuations. The reason for the similar time-based fluctuations is likely caused by increases or decreases in the quantity of that corresponding substance (if the quantity of the substance is increased, then the light emission intensity on the wavelength linked to that substance will increase as the quantity of that substance increases). By making use of this type of light emission intensity for monitoring, supervision, and control of the etching unit 10, the quantity of the substance contained in the gas 113 can be known, and monitoring, supervision, and control of the etching unit 10 can be effectively implemented.

Based on the above approach, the arithmetic logic unit 21 next compares the $R_1$ with the value stored in the threshold value 2 field 27c, and if $R_1$ is a value equal to or larger than the value stored in the threshold value 2 field 27c, then the arithmetic logic unit 21 judges that the wavelength identified by the value stored in the i-th row of the wavelength field 23c in the substance and matching wavelength table 23a is the wavelength capable of being utilized for monitoring, supervision, and control of the etching unit 10, and the arithmetic logic unit 21 proceeds to the process in S106.

If $R_1$ is a value smaller than the value stored in the threshold value 2 field 27c, then the arithmetic logic unit 21 proceeds to the process in S107.

(S106)

In S106, the arithmetic logic unit 21 stores the value "recommend 1" showing the judgment that the wavelength is capable of being utilized for monitoring, supervision, and control of the etching unit 10, into the i-th row of the recommended wavelength field 28d in recommended wavelength information table 28a.

(S107)

In S107, the arithmetic logic unit 21 utilizes the information stored in the identical substance correlating information table 25a to decide whether or not the wavelength specified by the value stored in the i-th row of wavelength field 23c in the substance and matching wavelength table 23a is the wavelength capable of being utilized for monitoring, supervision, and control of the etching unit 10.

The arithmetic logic unit 21 compares the value stored in the light emission intensity correlation 2 field 26e of peripheral wavelength correlating information table 26a, with the value stored in threshold value 3 field 27d of the threshold information table 27a. If the value stored in the light emission intensity correlation 2 field 26e is smaller than the value stored in the threshold value 3 field 27d, the waveform specified by the value stored in the i-th row of wavelength field 23c of the substance and matching wavelength table 23a is judged as the wavelength capable of being utilized for monitoring, supervision, and control of the etching unit 10, and the arithmetic logic unit 21 proceeds to the process in S108.

Figure 14:
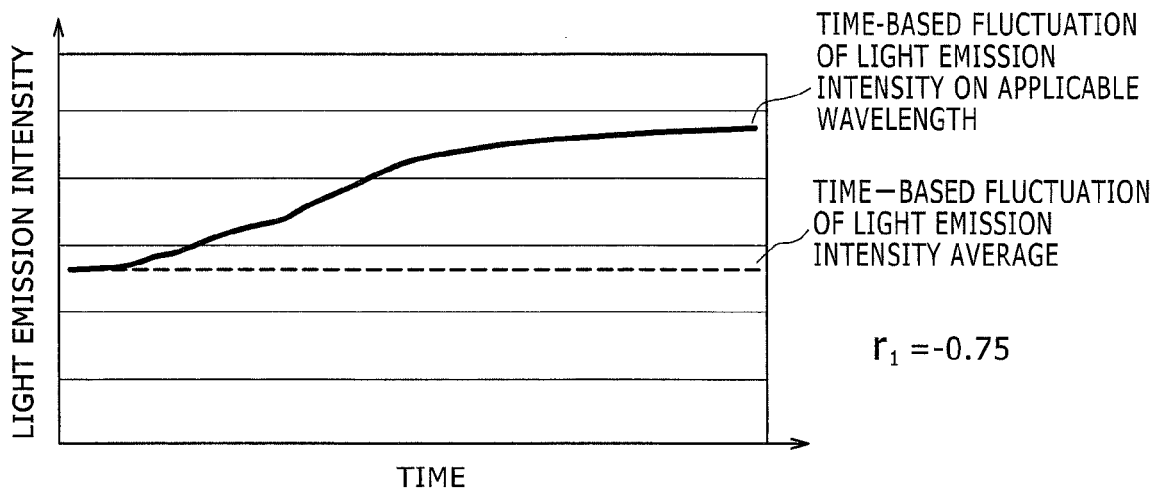
FIG. 14 is a graph for showing an example of the case where there is no correlation in time-based fluctuations among wavelengths.

However, if the value stored in the light emission intensity correlation 2 field 26e of the peripheral wavelength correlating information table 26a is small, the small value signifies that the degree of similarity between the time-based fluctuations in light emission intensity on the wavelength specified by the value stored in the i-th row of the waveform field 23c of the substance and matching wavelength table 23a, and average of time-based fluctuations for light emission intensity on the peripheral wavelength is small as shown in FIG. 14. In this case, the increase or decrease in the light emission intensity on the applicable wavelength is likely caused by factors such as the temperature and amount of that corresponding substance. Using the light emission intensity on this type of wavelength to monitor, supervise, and control the etching unit 10 permits knowing factors such as the temperature and amount of the substance contained in the gas 113, and the monitoring, supervision, and control of the etching unit 10 can be effectively implemented.

If the value stored in the light emission intensity correlation 2 field 26e is larger than the value stored in the threshold value 3 field 27d, the arithmetic logic unit 21 proceeds to the process in S109.
(S108)

In S108, the arithmetic logic unit 21 stores the value for "recommend 2" showing the judgment that the wavelength is capable of being utilized for monitoring, supervision, and control of the etching unit 10, into the i-th row of the recommended wavelength field 28d in the recommended wavelength information table 28a. If a value for "recommend 1" is already stored then "recommend 1" and "recommend 2" are both jointly recorded.
(S109)

In S109, if the processing in S106 or S108 was executed, the arithmetic logic unit 21 performs processing to provide a wavelength capable of being utilized for monitoring, supervision, and control of the etching unit 10 to the user.

Figure 15:
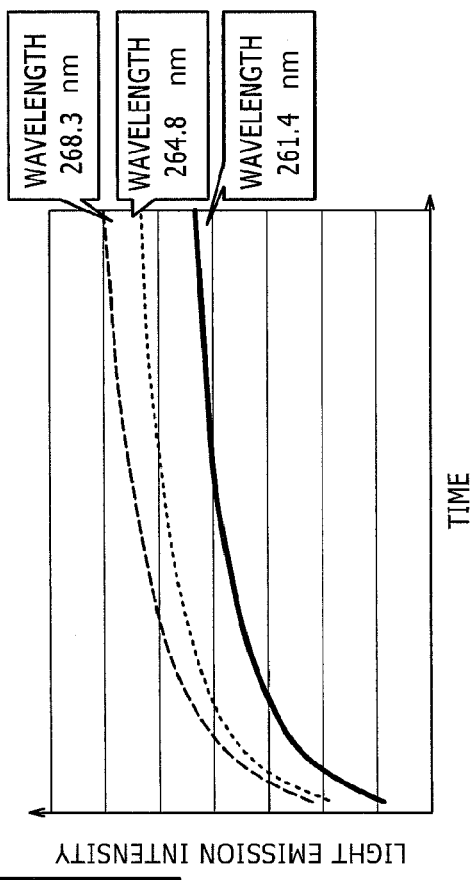
FIG. 15 is a drawing for showing an example of the display screen of the first embodiment of the present invention.

If there is a value for "recommend 1" stored in the i-th row in the recommended wavelength field 28d of the recommended wavelength information table 28a, the arithmetic logic unit 21 displays information as shown for example in FIG. 15 on the output unit 31.

The arithmetic logic unit 21 displays the wavelength (value stored in the i-th row of the wavelength field 23c of the substance and matching wavelength table 23a) recommended for utilization in device control and quality analysis, that is judged as the wavelength exhibiting light emitted from a substance contained in the plasma within the chamber; and the name of the substance corresponding to that wavelength (value stored in the i-th row of the substance field 23b of the substance and matching wavelength table 23a).

The arithmetic logic unit 21 also displays the correlation coefficient (value stored in the light emission intensity correlation 1 field 25e of the identical substance correlating information table 25a) between the time-based fluctuations for light emission intensity in the recommended wavelength, and the time-based fluctuations for light emission intensity in the wavelength from the same substance as the recommended wavelength.

The arithmetic logic unit 21 further displays a graph of the time-based fluctuations for light emission intensity in the recommended wavelength, and the time-based fluctuations (value stored in the light emission intensity field 24d of the OES data table 24a) for light emission intensity in the wavelength from the same substance as the recommended wavelength.

If there is a value for "recommend 2" stored in the i-th row of the recommended wavelength field 28d of the recommended wavelength information table 28a, the arithmetic logic unit 21 displays information as shown for example in FIG. 16 on the output unit 31.

The arithmetic logic unit 21 displays the recommended wavelength (value stored in the i-th row of the wavelength field 23c of the substance and matching wavelength table 23a) and the name of the substance corresponding to that wavelength (value stored in the i-th row of the substance field 23b of the substance and matching wavelength table 23a).

The arithmetic logic unit 21 also displays the correlation coefficient (value stored in the light emission intensity correlation 2 field 26e of the peripheral wavelength correlating information table 26a) between the time-based fluctuations for light emission intensity in the recommended wavelength, and the time-based fluctuations for the light emission intensity average on the recommended peripheral wavelength.

The arithmetic logic unit 21 further displays a graph of time-based fluctuations (value stored in the light emission intensity field 24d of OES data table 24a) for light emission intensity in the recommended wavelength; and the time-based fluctuations (value stored in light emission intensity average field 29d of the light emission intensity average information table 29a) for the light emission intensity in the wavelength from the same substance as the recommended wavelength.
(S110)

In S110, the arithmetic logic unit 21 ends the process when the process has reached the final row of wavelength field 23c of the substance and matching wavelength table 23a, and adds a 1 to if the process has not reached the final row, and executes the calculation for the next row of the wavelength field 23c in the substance and matching wavelength table 23a.

As described above, in the etching device 1 (analysis unit 20) of the present embodiment, the data measured by the spectroscope (OES), and information on the wavelength of light emitted by each substance can be provided as input information to provide a wavelength that allows knowing properties (such as the temperature and amount of substance contained in the gas 113) of the gas 113. By using the light emission intensity of the provided wavelength as an input, the control unit 13 of the etching unit 1 can perform the etching process with higher efficiency by appropriately controlling factors such as the quantity of gas, temperature, and voltage supplied to the chamber 111.

Moreover, a wavelength utilizable for monitoring, supervision, and control is automatically be selected from many candidates among wavelengths in the OES data so that the large quantity of man-hours required for analyzing the etching data can be eliminated and monitoring, supervising, and control of the etching can be efficiently performed.

The embodiment of the present invention was specifically described above, however the present invention is not limited to the above embodiment and all manner of variations and adaptations not departing from the scope of the present invention are permissible.

What is claimed is:
1. An analysis method comprising:
  measuring a light emission within a chamber during etching processing of a semiconductor wafer;

obtaining first time-based fluctuations on each wavelength of light emitted from a pre-identified substance due to changes over time in a measured intensity of the light emissions within the chamber;

obtaining second time-based fluctuations on each peripheral wavelength that is a wavelength at a predetermined distance from the wavelength of the light emitted from the pre-identified substance due to changes over time in the measured intensity of the light emissions within the chamber;

calculating a first correlation value which is a correlation value between the first time-based fluctuations on each wavelength of the light emitted from the pre-identified substance due to changes over time in the measured intensity of the light emissions within the chamber;

calculating a second correlation value which is a correlation value between the first time-based fluctuations and the second time-based fluctuations on each wavelength; and identifying a wavelength indicating light emitted from a substance contained in a plasma within the chamber by using the first and second correlation values.

2. The analysis method according to claim 1, wherein the time-based fluctuation in light emission intensity of the peripheral wavelength is the time-based fluctuation for an average value of light emission intensity from the wavelength that the identified substance emits light to a wavelength at the predetermined distance.

3. An analysis device comprising:
a processor unit configured to receive a measured light emission value within a chamber during etching of a semiconductor wafer,
wherein the processor unit is further configured to obtain first time-based fluctuation on each wavelength of light emitted from a pre-identified substance due to changes over time in a received intensity of the light emission within the chamber and second time-based fluctuations on each peripheral wavelength that is a wavelength at a predetermined distance from the wavelength of the light emitted from the pre-identified substance due to changes over time in the received intensity of the light emissions within the chamber,
calculate a first correlation value which is a correlation value between the first time-based fluctuations on each wavelength of the light emitted from the pre-identified substance due to changes over time in the received intensity of the light emissions within the chamber, and a second correlation value which is a correlation value between the first time-based fluctuations and second time-based fluctuations on each wavelength, and
identify the wavelength indicating light emitted from a substance contained in the plasma within the chamber by using the first and second correlation values.

4. The analysis device according to claim 3, wherein the time-based fluctuation in light emission intensity on the peripheral wavelength, is the time-based fluctuation for an average value of light emission intensity from the wavelength that the identified substance emits light to the wavelength at the predetermined distance.

5. An etching processing system to etch the semiconductor wafer comprising:
an etching device for etching the semiconductor wafer including
an etching unit that etches the semiconductor wafer inside the chamber and
a measuring unit that measures an intensity of light emission within the chamber; and
a device for analyzing the status of an etching processing,
wherein the device for analyzing the status of the etching processing receives the measured light emission intensity within the chamber,
obtains first time-based fluctuations on each wavelength of the light emitted from a pre-identified substance due to changes over time in a received intensity of the light emission within the chamber and second time-based fluctuations on each peripheral wavelength of the light emitted from the pre-identified substance due to changes over time in the received intensity of the light emissions within the chamber,
calculates a first correlation value which is a correlation value between the first time-based fluctuations on each wavelength of the light emitted from the pre-identified substance due to changes over time in the received intensity of the light emissions within the chamber, and a second correlation value which is a correlation value between the first time-based fluctuations and the second-time based fluctuations on each wavelength, and
identifies the wavelength indicating light emitted from a substance contained in the plasma within the chamber by using the first and second correlation values.

6. The etching processing system according to claim 5, wherein the time-based fluctuation in light emission intensity of the peripheral wavelength is the time-based fluctuation for an average value of light emission intensity from the wavelength that the identified substance emits light to the wavelength at the predetermined distance.

* * * * *